(12) United States Patent
Sato et al.

(10) Patent No.: US 11,593,070 B2
(45) Date of Patent: Feb. 28, 2023

(54) ARITHMETIC DEVICE

(71) Applicant: KABUSHIKI KAISHA TOSHIBA, Tokyo (JP)

(72) Inventors: Rie Sato, Yokohama Kanagawa (JP); Koichi Mizushima, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 16/814,479

(22) Filed: Mar. 10, 2020

(65) Prior Publication Data
US 2020/0394020 A1    Dec. 17, 2020

(30) Foreign Application Priority Data

Jun. 17, 2019 (JP) .............................. JP2019-112313

(51) Int. Cl.
*G06F 7/57* (2006.01)
*G06N 3/04* (2006.01)
(Continued)

(52) U.S. Cl.
CPC .............. *G06F 7/57* (2013.01); *G11C 11/407* (2013.01); *H01L 27/10805* (2013.01);
(Continued)

(58) Field of Classification Search
CPC .. G06F 7/57; G06F 2207/4802; G06F 7/5443; G11C 11/407; G11C 7/16; G11C 8/16; G11C 11/405; G11C 11/4096; G11C 7/1006; H01L 27/10805; H01L 27/10897; G06N 3/049; G06N 3/0635; G06N 3/061; G06N 3/063

See application file for complete search history.

(56) References Cited

U.S. PATENT DOCUMENTS 6,898,097 B2   5/2005  Dugger et al.
7,402,855 B2   7/2008  Kurjanowicz
(Continued)

FOREIGN PATENT DOCUMENTS

JP   S61-256760 A    11/1986
JP   2005-522071 A    7/2005
(Continued)

OTHER PUBLICATIONS

McCulloch et al., "A Logical Calculus of the Ideas Immanent in Nervous Activity," Bulletin of Mathematical Biology, 52:99-115 (1990), reprinted from Bulletin of Mathematical Biophysics, 5:115-133 (1943).
(Continued)

*Primary Examiner* — Ajay Ojha
(74) *Attorney, Agent, or Firm* — Finnegan, Henderson, Farabow, Garrett & Dunner, LLP (57) ABSTRACT

According to one embodiment, an arithmetic device includes an arithmetic circuit. The arithmetic circuit includes a memory part including a plurality of memory regions, and an arithmetic part. One of the memory regions includes a capacitance including a first terminal, and a first electrical circuit electrically connected to the first terminal and configured to output a voltage signal corresponding to a potential of the first terminal.

23 Claims, 7 Drawing Sheets

(51) Int. Cl.
*G06N 3/063* (2006.01)
*G11C 11/407* (2006.01)
*H01L 27/108* (2006.01)
*G06N 3/049* (2023.01)

(52) U.S. Cl.
CPC ........ *H01L 27/10897* (2013.01); *G06N 3/049* (2013.01); *G06N 3/0635* (2013.01)

(56) References Cited

U.S. PATENT DOCUMENTS

| | | | |
|---|---|---|---|
| 9,324,747 | B2 | 4/2016 | Yamazaki et al. |
| 9,721,959 | B2 | 8/2017 | Takahashi |
| 2007/0165441 | A1 | 7/2007 | Kurjanowicz et al. |
| 2007/0257331 | A1 | 11/2007 | Kurjanowicz et al. |
| 2012/0051118 | A1* | 3/2012 | Yamazaki .............. G11C 16/02 257/43 |
| 2012/0182782 | A1 | 7/2012 | Kurjanowicz et al. |
| 2012/0287693 | A1* | 11/2012 | Furutani .............. G11C 15/046 365/49.17 |
| 2013/0059238 | A1 | 3/2013 | Kurjanowicz |
| 2014/0209989 | A1 | 7/2014 | Kurjanowicz |
| 2018/0277192 | A1 | 9/2018 | Tanaka et al. |
| 2020/0019377 | A1 | 1/2020 | Sato et al. |
| 2021/0318856 | A1* | 10/2021 | Ikeda .................. H01L 27/1255 |
| 2021/0384193 | A1* | 12/2021 | Kimura ................ H01L 27/108 |

FOREIGN PATENT DOCUMENTS

| | | | |
|---|---|---|---|
| JP | 2010-515198 | A | 5/2010 |
| JP | 2013-232584 | A | 11/2013 |
| JP | 2015-18594 | A | 1/2015 |
| JP | 2015-188077 | A | 10/2015 |
| JP | 2018-156575 | A | 10/2018 |
| JP | 2019-21219 | A | 2/2019 |
| JP | 2019-36280 | A | 3/2019 |
| JP | 2020-9265 | A | 1/2020 |

OTHER PUBLICATIONS

Hopfield, "Neural networks and physical systems with emergent collective computational abilities," Proc. Natl. Acad. Sci. USA, 79:2554-58 (1982).

Merolla et al., "A million spiking-neuron integrated circuit with a scalable communication network and interface," Science, 345(6197):668-673 (Aug. 8, 2014).

\* cited by examiner

ARITHMETIC DEVICE

CROSS-REFERENCE TO RELATED APPLICATIONS

This application is based upon and claims the benefit of priority from Japanese Patent Application No. 2019-112313, filed on Jun. 17, 2019; the entire contents of which are incorporated herein by reference.

FIELD

Embodiments described herein relate generally to an arithmetic device.

BACKGROUND

For example, an arithmetic device is applied to a neuromorphic computer, etc. A practical arithmetic device is desirable.

DETAILED DESCRIPTION

According to one embodiment, an arithmetic device includes an arithmetic circuit. The arithmetic circuit includes a memory part including a plurality of memory regions, and an arithmetic part. One of the memory regions includes a capacitance including a first terminal, and a first electrical circuit electrically connected to the first terminal and configured to output a voltage signal corresponding to a potential of the first terminal.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
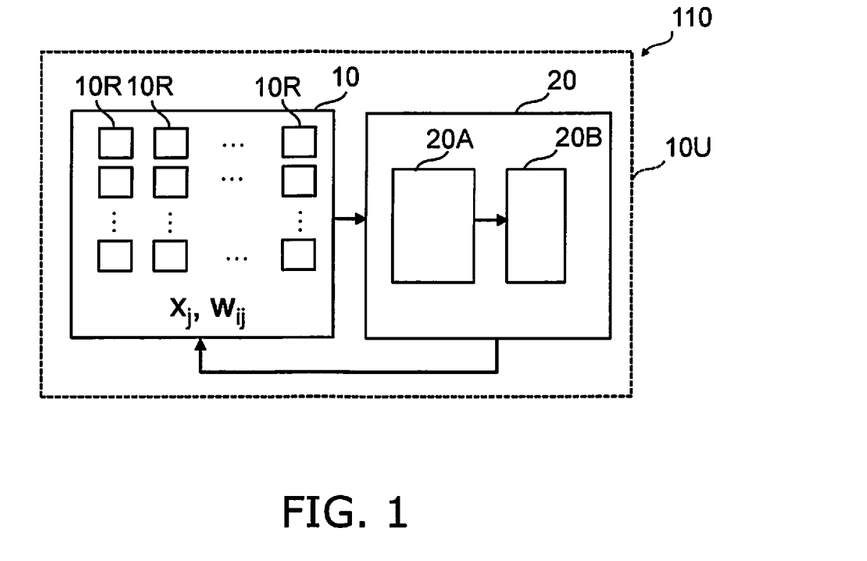
FIG. 1 is a schematic view illustrating an arithmetic device according to a first embodiment.

FIG. 1 is a schematic view illustrating an arithmetic device according to a first embodiment.

As shown in FIG. 1, the arithmetic device 110 according to the embodiment includes an arithmetic circuit 10U. The arithmetic circuit 10U is, for example, an arithmetic unit. The arithmetic circuit 10U includes a memory part 10 and an arithmetic part 20. The memory part 10 includes multiple memory regions 10R.

For example, a portion of the multiple memory regions 10R can store (or retain) a first variable group $x_j$. For example, another portion of the multiple memory regions 10R can store (or retain) a second variable group $w_{ij}$. The second variable group $w_{ij}$ may be, for example, a matrix.

For example, the arithmetic device 110 according to the embodiment can be used in arithmetic corresponding to a neural network. In such a case, for example, the first variable group $x_j$ corresponds to the states of neurons. For example, the second variable group $w_{ij}$ corresponds to the states of synapse parameters (e.g., the synaptic weight).

The information (e.g., the variable groups, etc.) that is stored in the memory part 10 is supplied to the arithmetic part 20. The arithmetic part 20 performs arithmetic based on the information. For example, the arithmetic includes a multiply-add operation.

As shown in FIG. 1, the arithmetic part 20 includes a multiply-add operation circuit 20A and a nonlinear transformation circuit 20B. The multiply-add operation circuit 20A performs a multiply-add operation of the first variable group $x_j$ and the second variable group $w_{ij}$ stored in the memory part 10. In one example, the multiply-add operation includes the arithmetic of $h_i = \Sigma w_{ij} x_j$. The nonlinear transformation circuit 20B performs a nonlinear transformation of the output of the multiply-add operation circuit 20A. The nonlinear transformation includes the derivation of the value of a nonlinear function of "$h_i$". The value after the transformation corresponds to the output value. For example, the arithmetic circuit 10U stores the result of the nonlinear transformation in the memory part 10.

The arithmetic circuit 10U functions as one "core".

Figure 2:
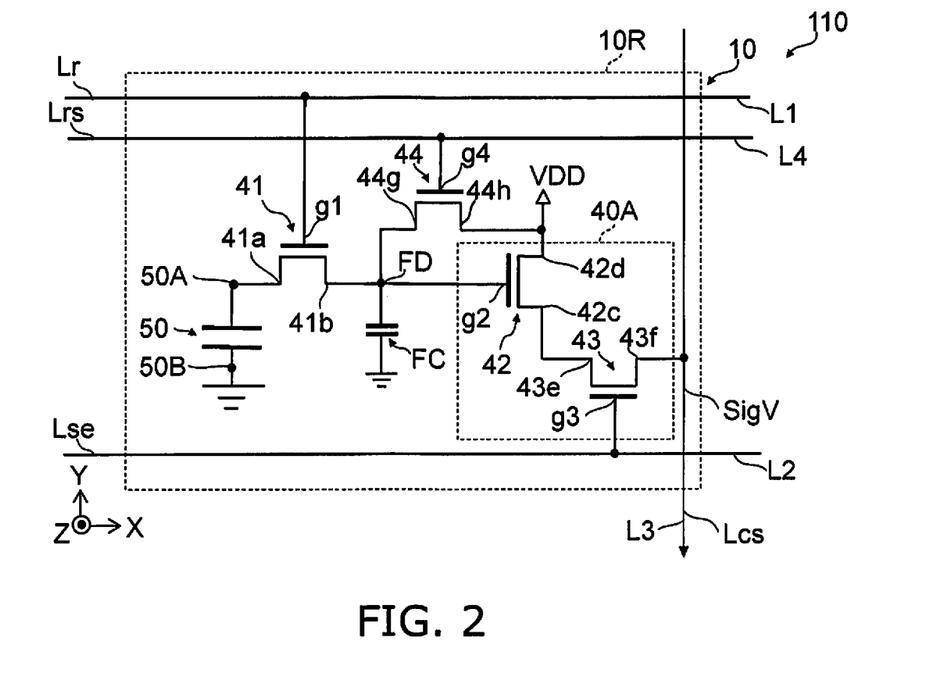
FIG. 2 is a schematic view illustrating the arithmetic device according to the first embodiment.

FIG. 2 is a schematic view illustrating the arithmetic device according to the first embodiment.

FIG. 2 illustrates one of the multiple memory regions 10R. As shown in FIG. 2, the one of the multiple memory regions 10R includes a capacitance 50 and a first electrical circuit 40A. The capacitance 50 includes a first terminal 50A and a second terminal 50B. For example, the second terminal 50B is set to a reference potential (e.g., a ground potential). The first electrical circuit 40A is electrically connected to the first terminal 50A.

In this specification, the state of being electrically connected includes the state in which a state is formable so that a current flows in multiple conductors. The state of being electrically connected includes, for example, the state in which multiple conductors physically contact each other. The state of being electrically connected includes, for example, the state in which multiple conductors are connected by another conductor. The other conductor may include a switch (e.g., a transistor or the like). For example, the state in which a switch (a transistor or the like) is provided between one conductor and another conductor so that a state is formable in which a current flows between the one conductor and the other conductor due to the operation of the switch also is included in the state of being electrically connected. In the example of FIG. 2, a first transistor 41 described below is provided between the first terminal 50A and the first electrical circuit 40A. A state in which a current flows between the first terminal 50A and the first electrical circuit 40A is formed by the first transistor 41 being set to a conducting state.

The first electrical circuit 40A is configured to output a voltage signal SigV corresponding to the potential of the first terminal 50A.

In the arithmetic device 110, a charge is stored in the capacitance 50 provided in each of the multiple memory regions 10R. The stored charge corresponds to information (a signal). The charge that is stored in the capacitance 50 is an analog quantity. In the arithmetic device 110, the multiple memory regions 10R are analog memory.

In the arithmetic device 110, for example, the charge that is stored in the capacitance 50 is converted directly into a voltage by the first electrical circuit 40A. The voltage that is obtained by the conversion is extracted as the voltage signal SigV. The stored state is read by detecting the voltage signal SigV. The voltage signal SigV is an analog quantity; and the stored state is analog. For the memory part 10 which is analog memory, high-speed operations are possible, and the reliability is high.

In the arithmetic device 110, an analog multiply-adder is applicable to the multiply-add operation circuit 20A. In the embodiment, for example, compared to the case where a digital circuit is used, the current consumption can be reduced by applying analog circuits to the memory part 10 and the arithmetic part 20. For example, the circuit configuration can be simple; and downsizing is easy. For example, large-scale arithmetic can be performed more easily.

According to the embodiment, a practical arithmetic device can be provided.

Higher performance and higher functionality are desirable for computers and electronic devices. It is desirable for the arithmetic device to be capable of accommodating an enormous amount of information processing. By increasing the scale of the information processing, for example, the enormous amount of information processing of the IoT (Internet of Things), AI (Artificial Intelligence), deep learning, etc., can be accommodated.

On the other hand, the development of energy-conserving electronics also is desirable. By higher energy conservation, for example, $CO_2$ reduction which is discussed on a global scale can be accommodated. By higher energy conservation, for example, the electrical power circumstances after a large-scale disaster can be relaxed.

For such conditions, neural networks are drawing attention as energy-conserving electronics that learn from living bodies. The relationship between neural networks and electronics has an old history. For example, the neuron model of McCulloch and Pitts presented in 1943 is known (W. S. McCulloch and W. Pitts: Bull. Math. Biophys. 5, 115 (1943)).

Subsequently, Hopfield had a major breakthrough in the field of neural networks in 1982 (J. J. Hopfield: Proc. Natl. Acad. Sci. U.S.A. 79, 2554 (1982)). He showed that an interconnected network can be represented by the Hamiltonian of an Ising spin model. Thereby, it is possible to examine information processing in a neural network by using the statistical mechanics of a spin system. Further, it became possible to associate Ising spins, which can have the binary states of up or down spins, with the activity of a neuron or an information bit.

As new hardware for a neural network, an element called the True North chip was developed jointly by IBM and Cornell University in 2014 (P. A. Merolla et al., Science 345, 668 (2014)). In this example, the element was constructed using 28-nm rule CMOS technology. As an entirety, the element operated as one million neurons. Compared to the brain of a human which is configured from 14 billion neurons, the scale of the element was small.

Neural network hardware that is typified by the True North chip also is called a neuromorphic computer. This is a massively parallel distributed computer. The massively parallel distributed computer includes many arithmetic units called cores. An arithmetic part and a memory part are provided in one of the arithmetic units. A multiply-add operation and the like are performed in the arithmetic part. For example, the states of the neurons, the synapse parameters, etc., are stored in the memory part.

Generally, SRAM is used in the memory part of a massively parallel distributed computer. A digital multiply-add operation element or the like that has large energy consumption is included in the arithmetic part.

There are expectations for neuromorphic computers to be used as large-scale energy-conserving information processing devices comparable to the human brain. However, currently, scale increases of neuromorphic computers are exceedingly insufficient. One factor is that a digital arithmetic unit which has large energy consumption is included in the arithmetic part of the arithmetic unit (the core).

In the embodiment, an analog memory in which high-speed operations are possible and the reliability is high is applied to the memory part 10 of the core. Thereby, it is easy to use an analog arithmetic device in the arithmetic part 20. Thereby, higher energy conservation of the arithmetic device is easy. A scale increase of the arithmetic device is easy. According to the embodiment, the practical use of a neuromorphic computer is easy.

As shown in FIG. 2, the memory part 10 includes a first line L1. The first line L1 is, for example, a read line Lr.

As shown in FIG. 2, one of the multiple memory regions 10R includes the first transistor 41. The first transistor 41 includes a first gate g1, a first end portion 41a, and a second end portion 41b. The first end portion 41a is, for example, one of a source or a drain. The second end portion 41b is, for example, the other of the source or the drain. The first gate g1 is electrically connected to the first line L1. The first end portion 41a is electrically connected to the first terminal 50A of the capacitance 50. The second end portion 41b is electrically connected to the first electrical circuit 40A.

For example, a read pulse is supplied to the first line L1. Thereby, a state is formed in which a current flows between the first electrical circuit 40A and the first terminal 50A of the capacitance 50. A value (the amount of charge) corresponding to the potential difference between the first terminal 50A and the second terminal 50B of the capacitance 50 is extracted as the voltage signal SigV by the first electrical circuit 40A. For example, the first transistor 41 functions as a transfer transistor.

As shown in FIG. 2, the current path between the first electrical circuit 40A and the second end portion 41b of the first transistor 41 includes a connection point FD. For example, the connection point FD corresponds to a floating diffusion layer. A stray capacitance FC can be considered to be formed between the connection point FD and the reference potential (e.g., the ground potential). For example, the first electrical circuit 40A extracts the potential of the connection point FD as the voltage signal SigV.

As shown in FIG. 2, the first electrical circuit 40A includes, for example, a second transistor 42 and a third transistor 43. The second transistor 42 includes a second gate g2, a third end portion 42c, and a fourth end portion 42d. The third end portion 42c is, for example, one of a source or a drain. The fourth end portion 42d is, for example, the other of the source or the drain. The third transistor 43 includes a third gate g3, a fifth end portion 43e, and a sixth end portion 43f. The fifth end portion 43e is, for example, one of a source or a drain. The sixth end portion 43f is, for example, the other of the source or the drain.

On the other hand, the memory part 10 includes a second line L2 and a third line L3. The second line L2 is, for example, a select line Lse. The third line L3 is, for example, a column signal line Lcs.

The second gate g2 is electrically connected to the second end portion 41b. In other words, the second gate g2 is electrically connected to the connection point FD. The third end portion 42c is electrically connected to the fifth end portion 43e. The fourth end portion 42d is set to a first potential VDD. The first potential VDD is, for example, a power supply potential. For example, the first potential VDD is higher than the reference potential. For example, the first potential VDD is higher than the potential of the second terminal 50B of the capacitance 50. The third gate g3 is electrically connected to the second line L2. The sixth end portion 43f is electrically connected to the third line L3. The voltage signal SigV is generated in the third line L3 when a select pulse is supplied to the second line L2.

As shown in FIG. 2, for example, the memory part 10 may include a fourth line L4. The fourth line L4 is, for example, a reset line Lrs. The one of the multiple memory regions 10R further includes a fourth transistor 44. The fourth transistor 44 includes a fourth gate g4, a seventh end portion 44g, and an eighth end portion 44h. The seventh end portion 44g is, for example, one of a source or a drain. The eighth end portion 44h is, for example, the other of the source or the drain. The fourth gate g4 is electrically connected to the fourth line L4. The seventh end portion 44g is electrically connected to the second end portion 41b. In other words, the seventh end portion 44g is electrically connected to the connection point FD. The eighth end portion 44h is electrically connected to the fourth end portion 42d. For example, the potential of the connection point FD is set to a reset state when a reset pulse is supplied to the fourth line L4.

As shown in FIG. 2, the first line L1, the second line L2, and the third line L3 extend along a first direction (e.g., an X-axis direction). A direction perpendicular to the X-axis direction is taken as a Y-axis direction. A direction perpendicular to the X-axis direction and the Y-axis direction is taken as a Z-axis direction. For example, the third line L3 extends along a second direction. The second direction crosses the first direction. In the example, the second direction is the Y-axis direction. For example, the multiple memory regions 10R are provided in a matrix configuration along the X-axis direction and the Y-axis direction.

In the embodiment, for example, the capacitance 50 functions as a memory cell. For example, in the case of converting to a voltage, a charge of about 1 mV to 1 V can be retained in the memory cell. The memory cell has a wide dynamic range (e.g., 1000). When the off-current of the first transistor (the transfer transistor) is large, there are cases where the charge cannot be retained for a long period of time. In such a case, the rewriting is performed at a frequency similar to that of DRAM.

In the embodiment, the off-current of the first transistor 41 can be reduced. For example, a small off-current is obtained by including an oxide semiconductor in the semiconductor included in the first transistor. The oxide semiconductor includes, for example, oxygen and at least one of In, Ga, or Zn. An off-current of about $10^{-21}$ A is obtained thereby.

On the other hand, it is favorable for the semiconductors included in the second transistor 42, the third transistor 43, and the fourth transistor 44 to include silicon. The stability of the operating characteristics is high for a transistor based on silicon. Thereby, high stability is obtained in the conversion from the charge to the voltage.

Because the first transistor 41 includes an oxide semiconductor and the second to fourth transistors 42 to 44 include silicon, high stability is obtained in the conversion from the charge to the voltage while stabilizing the retention state of the charge.

In the embodiment, the capacitance 50 may include a "buried p-n junction". The leakage current of the capacitance 50 can be reduced to about $10^{-17}$ A to $10^{-18}$ A.

Figure 3:
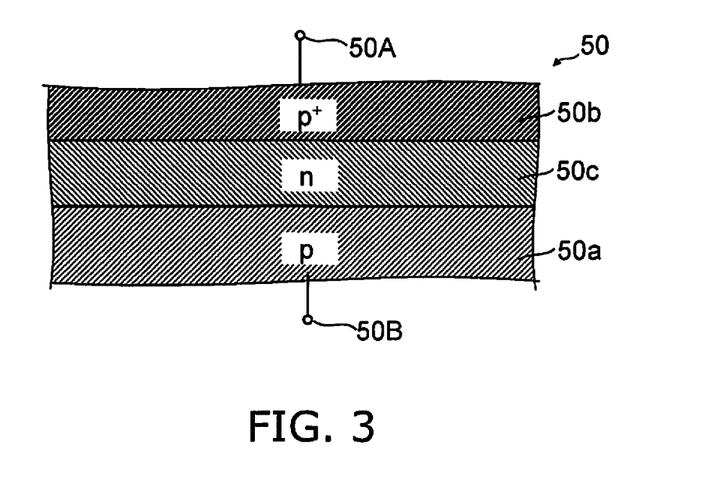
FIG. 3 is a schematic cross-sectional view illustrating a portion of the arithmetic device according to the first embodiment.

FIG. 3 is a schematic cross-sectional view illustrating a portion of the arithmetic device according to the first embodiment.

As shown in FIG. 3, the capacitance 50 includes a first semiconductor layer 50a, a second semiconductor layer 50b, and a third semiconductor layer 50c. The first semiconductor layer 50a is of a first conductivity type. The second semiconductor layer 50b is of the first conductivity type. The third semiconductor layer 50c is provided between the first semiconductor layer 50a and the second semiconductor layer 50b. The third semiconductor layer 50c is of a second conductivity type. In the example, the first conductivity type is a p-type; and the second conductivity type is an n-type. The first conductivity type may be the n-type; and the second conductivity type may be the p-type. For example, the first terminal 50A is electrically connected to the second semiconductor layer 50b.

The concentration of the impurity of the first conductivity type in the second semiconductor layer 50b is higher than the concentration of the impurity of the first conductivity type in the first semiconductor layer 50a. For example, the second semiconductor layer 50b is a $p^+$-region; and the first semiconductor layer 50a is, for example, a p-region. In such a case, the third semiconductor layer 50c is an n-region. In the embodiment, the second semiconductor layer 50b may be an $n^+$-region; the first semiconductor layer 50a may be an n-region; and the third semiconductor layer 50c may be a p-region.

The leakage current can be reduced by applying such a three-layer structure to the capacitance 50. A stable memory state is obtained.

In the embodiment, for example, the capacitance 50 may have a MOS structure. The capacitance 50 may include, for example, a tunnel junction. For example, the leakage current can be reduced by such structures. For example, a charge retention time of about 1000 hours is obtained.

Figure 4:
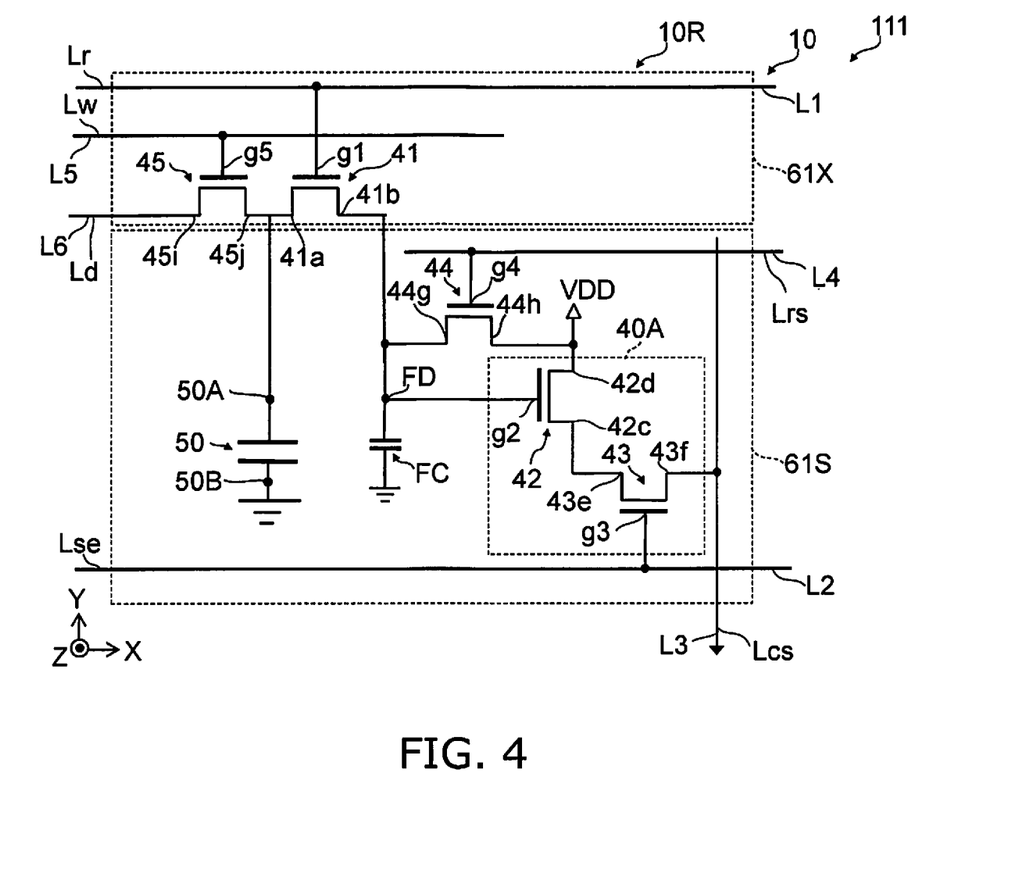
FIG. 4 is a schematic view illustrating an arithmetic device according to the first embodiment.

FIG. 4 is a schematic view illustrating an arithmetic device according to the first embodiment.

Figure 5:
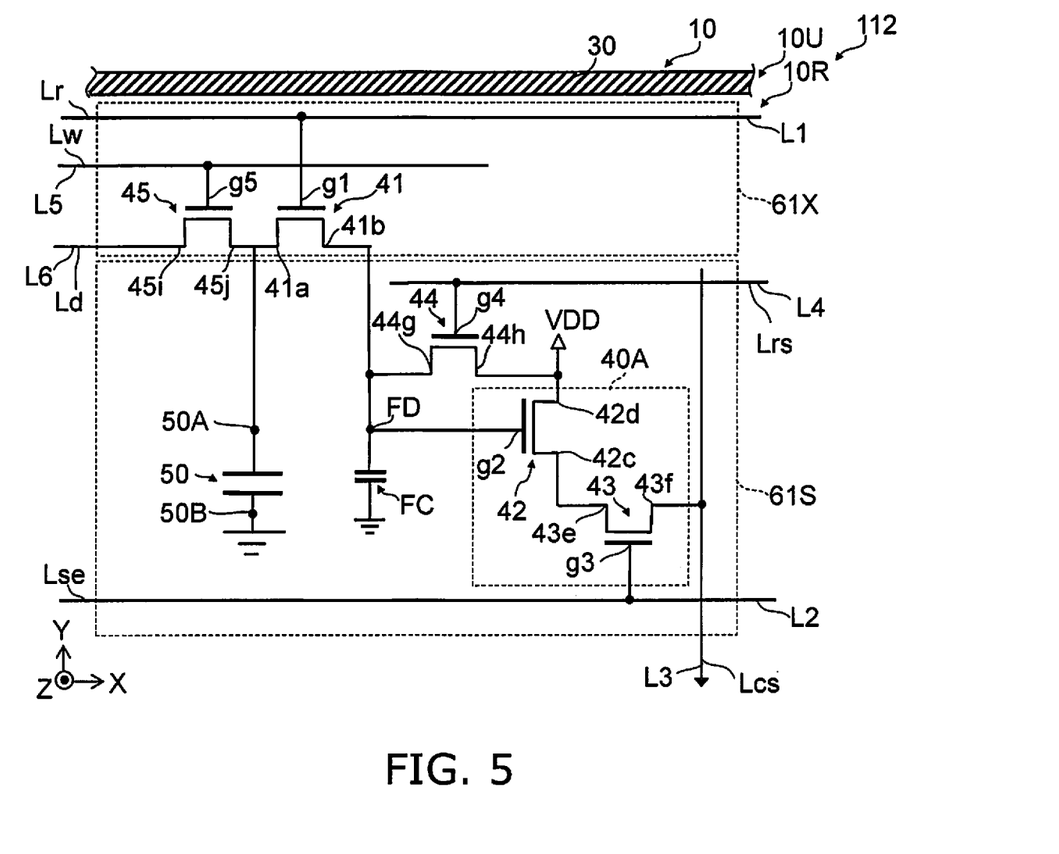
FIG. 5 is a schematic view illustrating an arithmetic device according to the first embodiment.

FIG. 4 illustrates one of the multiple memory regions 10R. In the arithmetic device 111 as shown in FIG. 5, the one of the multiple memory regions 10R includes the capacitance 50 and the first to fifth transistors 41 to 45. The configurations described in reference to FIG. 2 are applicable to the first to fourth transistors 41 to 44. The first to sixth lines L1 to L6 are provided in the example. The configurations described in reference to FIG. 2 are applicable to the first to fourth lines L1 to L4. Examples of the fifth transistor 45, the fifth line L5, and the sixth line L6 will now be described.

The fifth transistor 45 includes a fifth gate g5, a ninth end portion 45i, and a tenth end portion 45j. The fifth gate g5 is electrically connected to the fifth line L5. The fifth line L5 is, for example, a write control line Lw. The ninth end portion 45i is electrically connected to the sixth line L6. The sixth line L6 is, for example, a write data line Ld. The tenth end portion 45j is electrically connected to the first terminal 50A of the capacitance 50.

For example, when a write select pulse is supplied to the fifth line L5, a charge that corresponds to the potential of the sixth line L6 is supplied to the capacitance 50 via the fifth transistor 45. The desired information is stored in the capacitance 50. An analog quantity is stored in the capacitance 50. The first transistor 41 is in the off-state when the fifth transistor 45 is in the on-state. The first transistor 41 is in the on-state when the fifth transistor 45 is in the off-state.

For example, the fifth transistor 45 is directly connected to the capacitance 50. It is favorable for the off-current of the fifth transistor 45 to be small. In the embodiment, for example, it is favorable for the semiconductor included in the first transistor 41 and the semiconductor included in the fifth transistor 45 to include oxygen and at least one of In, Ga, or Zn.

Because the first transistor 41 and the fifth transistor 45 include oxide semiconductors and the second to fourth transistors 42 to 44 include silicon, high stability is obtained in the conversion from the charge to the voltage while stabilizing the retention state of the charge.

As shown in FIG. 4, for example, the first transistor 41 and the fifth transistor 45 are provided in an oxide semiconductor region 61X. The second to fourth transistors 42 to 44 are provided in a silicon semiconductor region 61S. For example, the capacitance 50 is provided in the silicon semiconductor region 61S.

Figure 6:
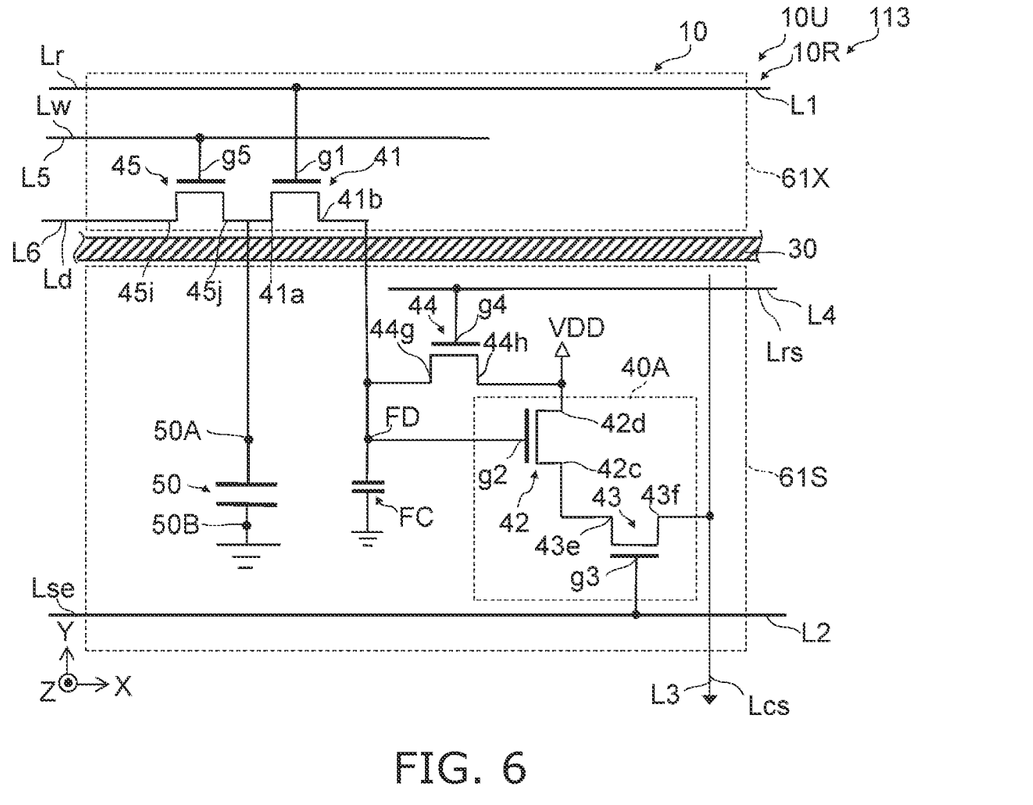
FIG. 6 is a schematic view illustrating an arithmetic device according to the first embodiment.

FIG. 5 and FIG. 6 are schematic views illustrating arithmetic devices according to the first embodiment.

In arithmetic devices 112 and 113 as shown in FIG. 5 and FIG. 6, the arithmetic circuit 10U includes a light-attenuating member 30. Otherwise, for example, the configuration of the arithmetic device 112 may be similar to that of the arithmetic device 111 or 110. Examples of the light-attenuating member 30 will now be described.

The light-attenuating member 30 overlaps the capacitance 50. In the example of the arithmetic device 112, the first transistor 41 and the fifth transistor 45 are between the capacitance 50 and the light-attenuating member 30. For example, the light-attenuating member 30 covers the silicon semiconductor region 61S and the oxide semiconductor region 61X. In the example of the arithmetic device 113, the light-attenuating member 30 is between the silicon semiconductor region 61S and the oxide semiconductor region 61X.

For example, the light transmittance of the light-attenuating member 30 is lower than the light transmittance of the semiconductor region (e.g., a first semiconductor region, e.g., an oxide semiconductor) included in the first transistor 41. For example, the light transmittance of the light-attenuating member 30 is lower than the light transmittance of the semiconductor layer (e.g., the first semiconductor layer 50a) included in the capacitance 50.

For example, when light from the outside is incident on the capacitance 50, there are cases where the state of the charge stored in the capacitance 50 changes. For example, when the light from the outside is incident on the first transistor 41, etc., there are cases where the characteristics of the first transistor 41 change. By providing the light-attenuating member 30, such a change of the characteristics can be suppressed. More stable memory operations are obtained. The light-attenuating member 30 is, for example, a light shield member.

Figure 7:
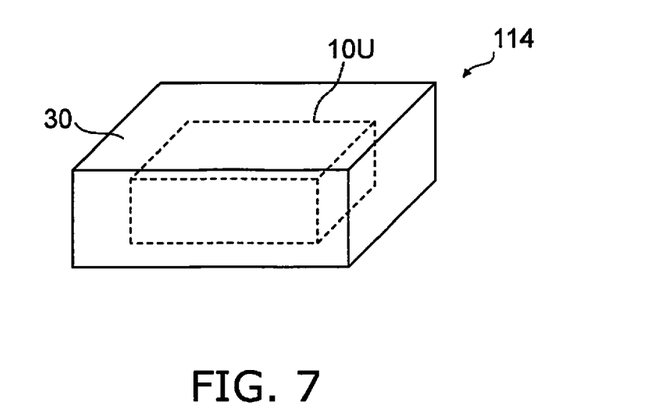
FIG. 7 is a schematic perspective view illustrating an arithmetic device according to the first embodiment.

FIG. 7 is a schematic perspective view illustrating an arithmetic device according to the first embodiment.

As shown in FIG. 7, the arithmetic device 114 includes the arithmetic circuit 10U and the light-attenuating member 30. For example, the light-attenuating member 30 is provided around the arithmetic circuit 10U. For example, the light-attenuating member 30 covers the arithmetic circuit 10U. More stable arithmetic operations are obtained.

The light-attenuating member 30 includes, for example, a resin, light-attenuating particles, etc. The resin includes, for example, an epoxy resin. The light-attenuating particles include, for example, carbon. The light-attenuating member 30 is, for example, insulative.

FIG. 8A to FIG. 8E are schematic cross-sectional views illustrating portions of the arithmetic device according to the first embodiment.

These drawings illustrate the transistors provided in one of the multiple memory regions 10R.

Figure 8A:
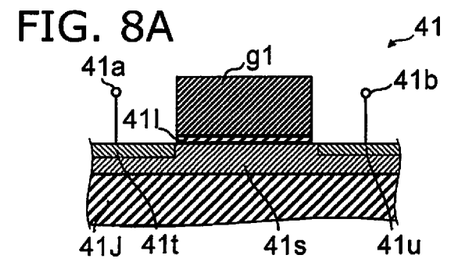
FIG. 8A to FIG. 8E are schematic cross-sectional views illustrating portions of the arithmetic device according to the first embodiment.

As shown in FIG. 8A, the first transistor 41 includes the first gate g1, the first end portion 41a, and the second end portion 41b. The first transistor 41 includes the first semiconductor region 41s. The first semiconductor region 41s includes, for example, oxygen and at least one of In, Ga, or Zn. The first semiconductor region 41s may further include Sn. The first semiconductor region 41s is an oxide semiconductor. Because the first semiconductor region 41s includes an oxide semiconductor, a small off-current is obtained in the first transistor 41. Stable memory operations are obtained.

As shown in FIG. 8A, contact regions 41t and 41u are provided in the first transistor 41. These contact regions correspond to the first end portion 41a and the second end portion 41b. For example, the oxygen concentrations in these contact regions are lower than the oxygen concentrations in the first semiconductor region 41s. An insulating film 41I is provided between the first gate g1 and the first semiconductor region 41s. The insulating film 41I corresponds to a gate insulating film. In the example, these components are provided on a base body 41J. In the first transistor 41, the vertical relationship of the first semiconductor region 41s and the first gate g1 is arbitrary.

Figure 8B:
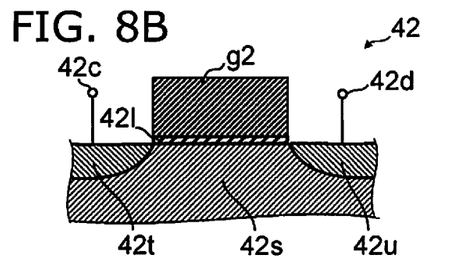

As shown in FIG. 8B, the second transistor 42 includes the second gate g2, the third end portion 42c, and the fourth end portion 42d. The second transistor 42 includes a second semiconductor region 42s. The second semiconductor region 42s includes, for example, silicon. Contact regions 42t and 42u are provided in the second transistor 42. These contact regions correspond to the third end portion 42c and the fourth end portion 42d. For example, an insulating film 42I is provided between the second gate g2 and the second semiconductor region 42s.

Figure 8C:
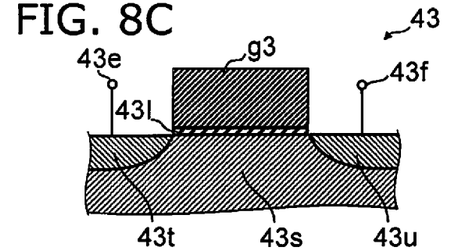

As shown in FIG. 8C, the third transistor 43 includes the third gate g3, the fifth end portion 43e, and the sixth end portion 43f. The third transistor 43 includes a third semiconductor region 43s. The third semiconductor region 43s includes, for example, silicon. Contact regions 43t and 43u are provided in the third transistor 43. These contact regions correspond to the fifth end portion 43e and the sixth end portion 43f. For example, an insulating film 43I is provided between the third gate g3 and the third semiconductor region 43s.

Figure 8D:
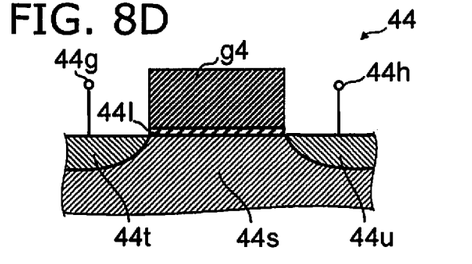

As shown in FIG. 8D, the fourth transistor 44 includes the fourth gate g4, the seventh end portion 44g, and the eighth end portion 44h. The fourth transistor 44 includes a fourth semiconductor region 44s. The fourth semiconductor region 44s includes, for example, silicon. Contact regions 44t and 44u are provided in the fourth transistor 44. These contact regions correspond to the seventh end portion 44g and the eighth end portion 44h. For example, an insulating film 44I is provided between the fourth gate g4 and the fourth semiconductor region 44s.

Figure 8E:
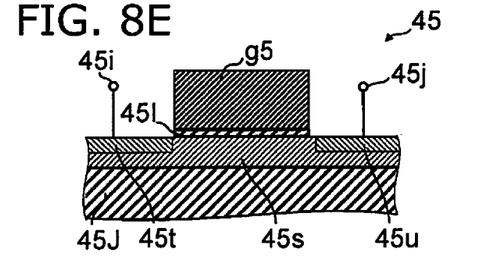

As shown in FIG. 8E, the fifth transistor 45 includes the fifth gate g5, the ninth end portion 45i, and the tenth end portion 45j. The fifth transistor 45 includes a fifth semiconductor region 45s. The fifth semiconductor region 45s includes, for example, oxygen and at least one of In, Ga, or Zn. The fifth semiconductor region 45s may further include Sn. The fifth semiconductor region 45s is an oxide semiconductor. Because the fifth semiconductor region 45s includes an oxide semiconductor, a small off-current is obtained in the fifth transistor 45. Stable memory operations are obtained.

As shown in FIG. 8E, contact regions 45t and 45u are provided in the fifth transistor 45. These contact regions correspond to the ninth end portion 45i and the tenth end portion 45j. For example, the oxygen concentrations in these contact regions are lower than the oxygen concentrations in the fifth semiconductor region 45s. An insulating film 45I is provided between the fifth gate g5 and the fifth semiconductor region 45s. The insulating film 45I corresponds to a gate insulating film. In the example, these components are provided on a base body 45J. In the fifth transistor 45, the vertical relationship of the fifth semiconductor region 45s and the fifth gate g5 is arbitrary.

Second Embodiment

Figure 9:
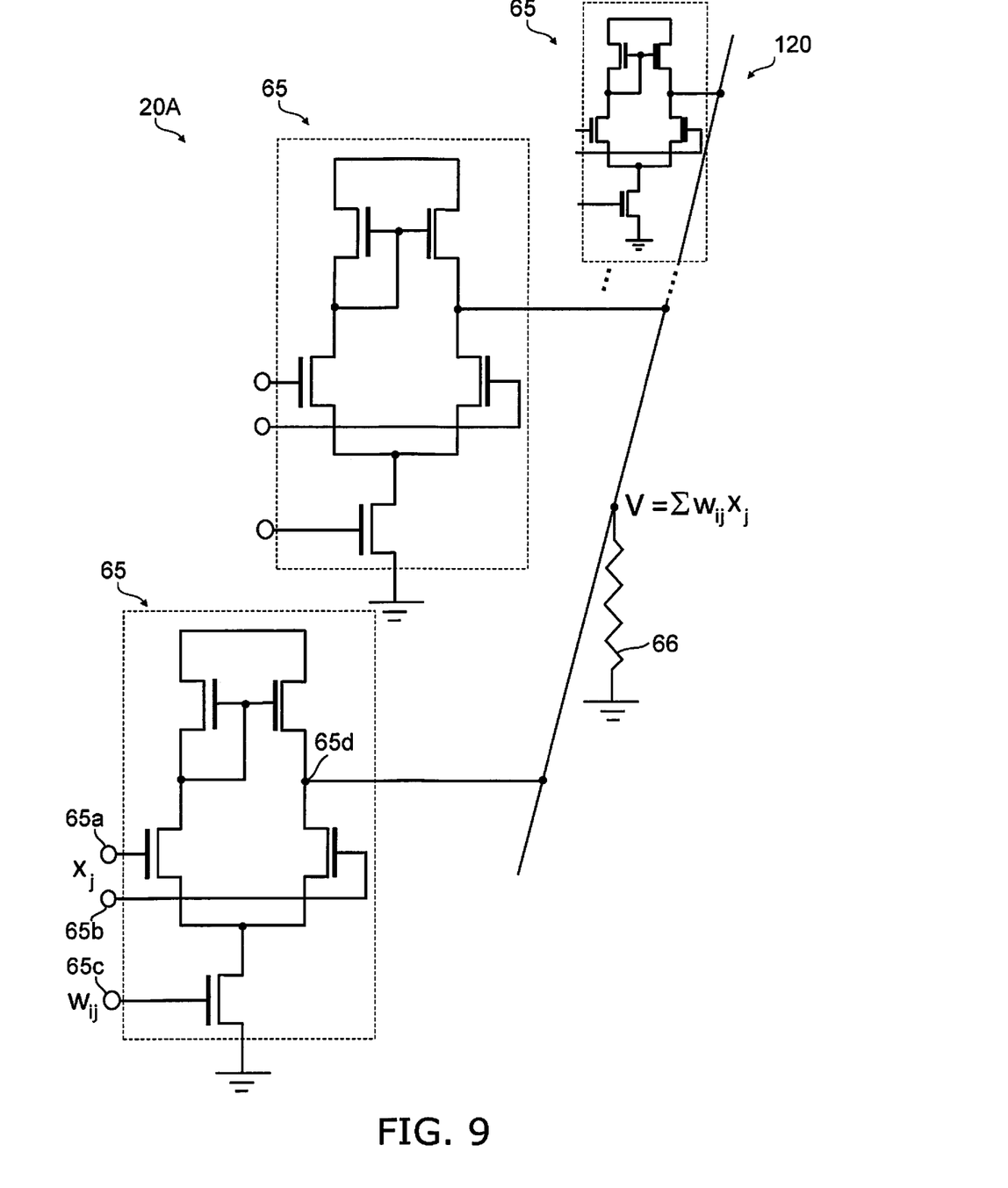
FIG. 9 is a schematic view illustrating a portion of an arithmetic device according to a second embodiment.

FIG. 9 is a schematic view illustrating a portion of an arithmetic device according to a second embodiment.

The arithmetic device 120 also includes the arithmetic circuit 10U; and the arithmetic circuit 10U includes the memory part 10 and the arithmetic part 20 (referring to FIG. 1). FIG. 9 illustrates the multiply-add operation circuit 20A included in the arithmetic part 20 of the arithmetic device 120.

As shown in FIG. 9, the multiply-add operation circuit 20A includes multiple differential amplifier circuits 65 and a resistance 66. The resistance 66 is electrically connected to the outputs of the multiple differential amplifier circuits 65.

For each of the multiple differential amplifier circuits 65, a voltage that corresponds to one value of the first variable group $x_j$ is input between a first input 65a and a second input 65b. For each of the multiple differential amplifier circuits 65, one voltage that corresponds to the second variable group $w_{ij}$ is input to a third input 65c. For each of the differential amplifier circuits 65, a value (the voltage of a connection point 65d) that corresponds to the product of the first variable group $x_j$ and the second variable group $w_{ij}$ is output. The value that corresponds to the product is, for example, a current value. The current values that correspond to the products from the multiple differential amplifier circuits 65 are added by the resistance 66 and converted into a voltage. Thus, the result of the multiply-add operation of the first variable group $x_j$ and the second variable group $w_{ij}$ is obtained. This result is used as an input to the next neuron circuit.

In the embodiment, the multiply-add operation circuit 20A includes an analog arithmetic unit. Thereby, for example, compared to the case where a digital arithmetic unit is used, the current consumption can be reduced. For example, the circuit configuration can be simple; and downsizing is easy. For example, large-scale arithmetic can be performed more easily.

The multiply-add operation circuit 20A illustrated in FIG. 9 is applicable to any arithmetic device according to the first embodiment.

Generally, digital elements are used in the memory part and the arithmetic part. A digital arithmetic device is one factor obstructing the scale increase of neuromorphic computers because the power consumption is large. Generally, an analog device is desirable to reduce the power consumption. However, an analog device is sensitive to the fluctuation of the characteristics of the individual elements. Therefore, many electronic devices in which high reliability is necessary are being digitized; and such a trend continues even today.

One feature of a neuromorphic computer is the learning function. This feature is different from many electronic devices which operate according to set parameters. In a neuromorphic computer, it is possible to absorb much of the fluctuation of the characteristics of the individual elements by the learning function. For example, it is possible to include the fluctuation of the gain of a transistor circuit functioning as an analog memory cell in a trainable synapse parameter (the second variable group $w_{ij}$). In a neuromorphic computer, the temporal stability of the individual transistors is necessary; and the fluctuation of the characteristics of the multiple transistors is not very problematic.

In the embodiment, by using an analog circuit, a memory element in which the temporal stability is high can be obtained. In the embodiment, by using an analog memory device and an analog arithmetic device, a large-scale parallel distributed computer that has a learning function and excellent energy conservation can be obtained.

Figure 10:
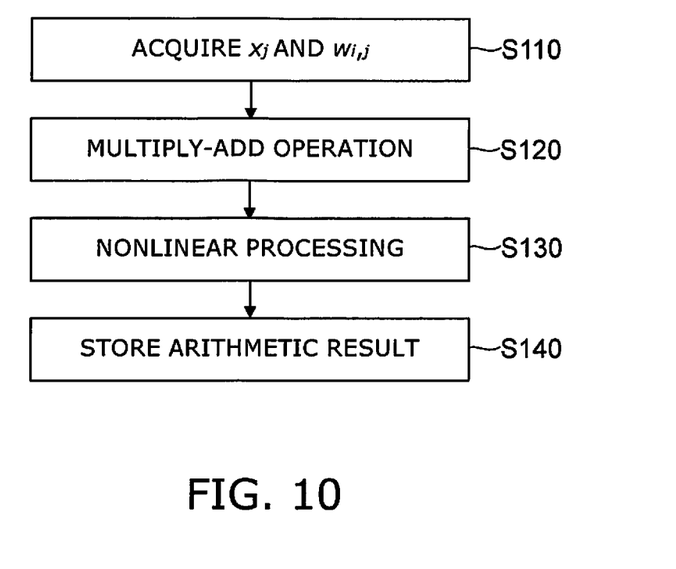
FIG. 10 is a flowchart illustrating an operation of the arithmetic device according to the embodiment.

FIG. 10 is a flowchart illustrating an operation of the arithmetic device according to the embodiment.

As shown in FIG. 10, the arithmetic part 20 acquires the first variable group $x_j$ and the second variable group $w_{ij}$ stored in the memory part 10 (step S110). The arithmetic part 20 performs a multiply-add operation of the first variable group $x_j$ and the second variable group $w_{ij}$ (step S120). The arithmetic part 20 performs nonlinear processing (a nonlinear transformation) of the result of the multiply-add operation (step S130). The arithmetic circuit 10U stores the result of the nonlinear transformation in the memory part 10 (step S140). Such processing may be performed repeatedly. For example, the operation of a neuromorphic computer is obtained. For example, the arithmetic circuit 10U includes a learning function. The arithmetic circuit 10U is a spiking neural network.

The embodiments may include the following configurations (e.g., technological proposals).

Configuration 1

An arithmetic device, comprising an arithmetic circuit, the arithmetic circuit including:

a memory part including a plurality of memory regions; and an arithmetic part, one of the plurality of memory regions including:

a capacitance including a first terminal; and a first electrical circuit electrically connected to the first terminal and configured to output a voltage signal corresponding to a potential of the first terminal.

Configuration 2

The arithmetic device according to Configuration 1, wherein the capacitance includes:

a first semiconductor layer of a first conductivity type;

a second semiconductor layer of the first conductivity type; and a third semiconductor layer provided between the first semiconductor layer and the second semiconductor layer, the third semiconductor layer being of a second conductivity type, and a concentration of an impurity of the first conductivity type in the second semiconductor layer is higher than a concentration of the impurity of the first conductivity type in the first semiconductor layer.

Configuration 3

The arithmetic device according to Configuration 2, wherein the first terminal is electrically connected to the second semiconductor layer.

Configuration 4

The arithmetic device according to any one of Configurations 1 to 3, wherein the memory part includes a first line, the one of the plurality of memory regions further includes a first transistor, the first transistor includes a first gate, a first end portion, and a second end portion, the first gate is electrically connected to the first line, the first end portion is electrically connected to the first terminal, and the second end portion is electrically connected to the first electrical circuit.

Configuration 5

The arithmetic device according to Configuration 4, wherein the first transistor includes a first semiconductor region, and the first semiconductor region includes oxygen and at least one of In, Ga, or Zn.

Configuration 6

The arithmetic device according to Configuration 5, wherein the first electrical circuit further includes a second transistor, the second transistor includes a second semiconductor region, and the second semiconductor region includes silicon.

Configuration 7

The arithmetic device according to Configuration 4, wherein the memory part further includes a second line and a third line, the first electrical circuit includes a second transistor and a third transistor, the second transistor includes a second gate, a third end portion, and a fourth end portion, the third transistor includes a third gate, a fifth end portion, and a sixth end portion, the second gate is electrically connected to the second end portion, the third end portion is electrically connected to the fifth end portion, the fourth end portion is set to a first potential, the third gate is electrically connected to the second line, and the sixth end portion is electrically connected to the third line.

Configuration 8

The arithmetic device according to Configuration 7, wherein the first transistor includes a first semiconductor region, the second transistor includes a second semiconductor region, the third transistor includes a third semiconductor region, the first semiconductor region includes oxygen and at least one of In, Ga, or Zn, and at least one of the second semiconductor region or the third semiconductor region includes silicon.

Configuration 9

The arithmetic device according to Configuration 7, wherein the memory part includes a fourth line, the one of the plurality of memory regions further includes a fourth transistor, the fourth transistor includes a fourth gate, a seventh end portion, and an eighth end portion, the fourth gate is electrically connected to the fourth line, the seventh end portion is electrically connected to the second end portion, and the eighth end portion is electrically connected to the fourth end portion.

Configuration 10

The arithmetic device according to Configuration 9, wherein the first transistor includes a first semiconductor region, the second transistor includes a second semiconductor region, the third transistor includes a third semiconductor region, the fourth transistor includes a fourth semiconductor region, the first semiconductor region includes oxygen and at least one of In, Ga, or Zn, and at least one of the second semiconductor region, the third semiconductor region, or the fourth semiconductor region includes silicon.

Configuration 11

The arithmetic device according to Configuration 9, wherein the memory part includes a fifth line and a sixth line, the one of the plurality of memory regions further includes a fifth transistor, the fifth transistor includes a fifth gate, a ninth end portion, and a tenth end portion, the fifth gate is electrically connected to the fifth line, the ninth end portion is electrically connected to the sixth line, and the tenth end portion is electrically connected to the first terminal.

Configuration 12

The arithmetic device according to Configuration 11, wherein the first transistor includes a first semiconductor region, the second transistor includes a second semiconductor region, the third transistor includes a third semiconductor region, the fourth transistor includes a fourth semiconductor region, the fifth transistor includes a fifth semiconductor region, the first semiconductor region and the fifth semiconductor region include oxygen and at least one of In, Ga, or Zn, and at least one of the second semiconductor region, the third semiconductor region, or the fourth semiconductor region includes silicon.

Configuration 13

The arithmetic device according to Configurations 5, 8, 10, or 12, wherein the arithmetic circuit includes a light-attenuating member overlapping the capacitance, and a light transmittance of the light-attenuating member is lower than a light transmittance of the first semiconductor region.

Configuration 14

The arithmetic device according to Configuration 2, wherein the arithmetic circuit includes a light-attenuating member overlapping the capacitance, and a light transmittance of the light-attenuating member is lower than a light transmittance of the first semiconductor layer.

Configuration 15

The arithmetic device according to any one of Configurations 1 to 14, wherein the arithmetic part includes:
 a multiply-add operation circuit performing a multiply-add operation of a first variable group and a second variable group stored in the memory part, and
 a nonlinear transformation circuit performing a nonlinear transformation of an output of the multiply-add operation circuit.

Configuration 16

The arithmetic device according to Configuration 15, wherein the multiply-add operation circuit includes an analog arithmetic unit.

Configuration 17

The arithmetic device according to Configuration 15, wherein the multiply-add operation circuit includes:
 a plurality of differential amplifier circuits; and
 a resistance electrically connected to outputs of the plurality of differential amplifier circuits.

Configuration 18

The arithmetic device according to any one of Configurations 1 to 17, wherein the arithmetic part acquires a first variable group and a second variable group stored in the memory part, the arithmetic part performs a multiply-add operation of the first variable group and the second variable group, the arithmetic part performs a nonlinear transformation of a result of the multiply-add operation, and the arithmetic circuit stores a result of the nonlinear transformation in the memory part.

Configuration 19

The arithmetic device according to any one of Configurations 1 to 18, wherein the arithmetic circuit includes a learning function.

Configuration 20

An arithmetic device according to any one of Configurations 1 to 19, wherein the arithmetic circuit is a spiking neural network.

According to the embodiments, a practical arithmetic device can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in arithmetic devices such as arithmetic circuits, memory parts, memory regions, capacitances, transistors, arithmetic parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all arithmetic devices practicable by an appropriate design modification by one skilled in the art based on the arithmetic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An arithmetic device, comprising an arithmetic circuit, the arithmetic circuit including:
 a memory part including a plurality of memory regions; and
 an arithmetic part,
one of the plurality of memory regions including:
 a capacitance including a first terminal; and
 a first electrical circuit electrically connected to the first terminal and configured to output a voltage signal corresponding to a potential of the first terminal,
wherein the capacitance includes:
 a first semiconductor layer of a first conductivity type;
 a second semiconductor layer of the first conductivity type; and
 a third semiconductor layer provided between the first semiconductor layer and the second semiconductor layer, the third semiconductor layer being of a second conductivity type, and
 a concentration of an impurity of the first conductivity type in the second semiconductor layer is higher than a concentration of the impurity of the first conductivity type in the first semiconductor layer.

2. The device according to claim 1, wherein the first terminal is electrically connected to the second semiconductor layer.

3. The device according to claim 1, wherein
the memory part includes a first line,
the one of the plurality of memory regions further includes a first transistor,
the first transistor includes a first gate, a first end portion, and a second end portion,
the first gate is electrically connected to the first line,
the first end portion is electrically connected to the first terminal, and
the second end portion is electrically connected to the first electrical circuit.

4. The device according to claim 3, wherein
the first transistor includes a first semiconductor region, and
the first semiconductor region includes oxygen and at least one of In, Ga, or Zn.

5. The device according to claim 4, wherein
the first electrical circuit further includes a second transistor,
the second transistor includes a second semiconductor region, and
the second semiconductor region includes silicon.

6. The device according to claim 3, wherein
the memory part further includes a second line and a third line,
the first electrical circuit includes a second transistor and a third transistor,
the second transistor includes a second gate, a third end portion, and a fourth end portion,
the third transistor includes a third gate, a fifth end portion, and a sixth end portion,
the second gate is electrically connected to the second end portion,
the third end portion is electrically connected to the fifth end portion,
the fourth end portion is set to a first potential,
the third gate is electrically connected to the second line, and
the sixth end portion is electrically connected to the third line.

7. The device according to claim 6, wherein
the first transistor includes a first semiconductor region,
the second transistor includes a second semiconductor region,
the third transistor includes a third semiconductor region,
the first semiconductor region includes oxygen and at least one of In, Ga, or Zn, and
at least one of the second semiconductor region or the third semiconductor region includes silicon.

8. The device according to claim 6, wherein
the memory part includes a fourth line,
the one of the plurality of memory regions further includes a fourth transistor,
the fourth transistor includes a fourth gate, a seventh end portion, and an eighth end portion,
the fourth gate is electrically connected to the fourth line,
the seventh end portion is electrically connected to the second end portion, and
the eighth end portion is electrically connected to the fourth end portion.

9. The device according to claim 8, wherein
the first transistor includes a first semiconductor region,
the second transistor includes a second semiconductor region,
the third transistor includes a third semiconductor region,
the fourth transistor includes a fourth semiconductor region,
the first semiconductor region includes oxygen and at least one of In, Ga, or Zn, and
at least one of the second semiconductor region, the third semiconductor region, or the fourth semiconductor region includes silicon.

10. The device according to claim 8, wherein
the memory part includes a fifth line and a sixth line,
the one of the plurality of memory regions further includes a fifth transistor,
the fifth transistor includes a fifth gate, a ninth end portion, and a tenth end portion,
the fifth gate is electrically connected to the fifth line,
the ninth end portion is electrically connected to the sixth line, and
the tenth end portion is electrically connected to the first terminal.

11. The device according to claim 10, wherein
the first transistor includes a first semiconductor region,
the second transistor includes a second semiconductor region,
the third transistor includes a third semiconductor region,
the fourth transistor includes a fourth semiconductor region,
the fifth transistor includes a fifth semiconductor region,
the first semiconductor region and the fifth semiconductor region include oxygen and at least one of In, Ga, or Zn, and
at least one of the second semiconductor region, the third semiconductor region, or the fourth semiconductor region includes silicon.

12. The device according to claim 4, wherein
the arithmetic circuit includes a light-attenuating member overlapping the capacitance, and
a light transmittance of the light-attenuating member is lower than a light transmittance of the first semiconductor region.

13. The device according to claim 1, wherein
the arithmetic circuit includes a light-attenuating member overlapping the capacitance, and
a light transmittance of the light-attenuating member is lower than a light transmittance of the first semiconductor layer.

14. The device according to claim 1, wherein
the arithmetic part includes:
a multiply-add operation circuit performing a multiply-add operation of a first variable group and a second variable group stored in the memory part; and
a nonlinear transformation circuit performing a nonlinear transformation of an output of the multiply-add operation circuit.

15. The device according to claim 14, wherein the multiply-add operation circuit includes an analog arithmetic unit.

16. The device according to claim 14, wherein
the multiply-add operation circuit includes:
a plurality of differential amplifier circuits; and
a resistance electrically connected to outputs of the plurality of differential amplifier circuits.

17. The device according to claim 1, wherein
the arithmetic part acquires a first variable group and a second variable group stored in the memory part,
the arithmetic part performs a multiply-add operation of the first variable group and the second variable group,
the arithmetic part performs a nonlinear transformation of a result of the multiply- add operation, and
the arithmetic circuit stores a result of the nonlinear transformation in the memory part.

18. The device according to claim 1, wherein the arithmetic circuit includes a learning function.

19. The device according to claim 1, wherein the arithmetic circuit is a spiking neural network.

20. An arithmetic device, comprising an arithmetic circuit,
the arithmetic circuit including:
a memory part including a plurality of memory regions; and
an arithmetic part, one of the plurality of memory regions including:
a capacitance including a first terminal; and
a first electrical circuit electrically connected to the first terminal and configured to output a voltage signal corresponding to a potential of the first terminal,
wherein:
the memory part includes a first line,
the one of the plurality of memory regions further includes a first transistor,
the first transistor includes a first gate, a first end portion, and a second end portion,
the first gate is electrically connected to the first line,
the first end portion is electrically connected to the first terminal, and
the second end portion is electrically connected to the first electrical circuit,
the first transistor includes a first semiconductor region,
the first semiconductor region includes oxygen and at least one of In, Ga, or Zn,
the first electrical circuit includes a second transistor and a third transistor,
the second transistor includes a second semiconductor region,
the third transistor includes a third semiconductor region,
the second semiconductor region and the third semiconductor region include silicon,
the arithmetic circuit includes a light-attenuating member overlapping the capacitance,
a light transmittance of the light-attenuating member is lower than a light transmittance of the first semiconductor region, and
the light-attenuating member is provided between the capacitance and first semiconductor region, between the second semiconductor region and first semiconductor region, and between the third semiconductor region and first semiconductor region.

21. The device according to claim 20, wherein
the memory part further includes a second line and a third line,
the second transistor includes a second gate, a third end portion, and a fourth end portion,
the third transistor includes a third gate, a fifth end portion, and a sixth end portion,
the second gate is electrically connected to the second end portion,
the third end portion is electrically connected to the fifth end portion,
the third gate is electrically connected to the second line, and
the sixth end portion is electrically connected to the third line.

22. The device according to claim 21, wherein the fourth end portion is set to a first potential.

23. An arithmetic device, comprising an arithmetic circuit,
the arithmetic circuit including:
a memory part including a plurality of memory regions; and
an arithmetic part,
one of the plurality of memory regions including:
a capacitance including a first terminal; and
a first electrical circuit electrically connected to the first terminal and configured to output a voltage signal corresponding to a potential of the first terminal,
wherein
the memory part includes a first line,
the one of the plurality of memory regions further includes a first transistor,
the first transistor includes a first gate, a first end portion, and a second end portion,
the first gate is electrically connected to the first line,
the first end portion is electrically connected to the first terminal,
the second end portion is electrically connected to the first electrical circuit.
the memory part further includes a second line and a third line,
the first electrical circuit includes a second transistor and a third transistor,
the second transistor includes a second gate, a third end portion, and a fourth end portion,
the third transistor includes a third gate, a fifth end portion, and a sixth end portion,
the second gate is electrically connected to the second end portion,
the third end portion is electrically connected to the fifth end portion,
the fourth end portion is set to a first potential,
the third gate is electrically connected to the second line, and
the sixth end portion is electrically connected to the third line.

* * * * *